United States Patent
Kim et al.

(10) Patent No.: US 7,605,478 B2
(45) Date of Patent: Oct. 20, 2009

(54) SEMICONDUCTOR PACKAGE AND METHOD OF MANUFACTURING THE SAME

(75) Inventors: Kyung-Man Kim, Chungcheongnam-do (KR); Sun-Mo Yang, Chungcheongnam-do (KR); Chang-Hoon Han, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/961,777

(22) Filed: Dec. 20, 2007

(65) Prior Publication Data

US 2008/0150167 A1    Jun. 26, 2008

(30) Foreign Application Priority Data

Dec. 20, 2006    (KR) ...................... 10-2006-0130837

(51) Int. Cl.
*H01L 23/48* (2006.01)
(52) U.S. Cl. ........................ 257/777; 257/678; 257/686; 257/780; 257/784; 438/107; 438/613; 438/617
(58) Field of Classification Search ................ 257/686, 257/784, E23.015; 438/617
See application file for complete search history.

(56) References Cited

U.S. PATENT DOCUMENTS

| 6,778,406 B2 * | 8/2004 | Eldridge et al. ............. 361/776 |
| 6,937,477 B2 | 8/2005 | Wu |
| 2005/0156303 A1 * | 7/2005 | Wu ........................... 257/686 |

FOREIGN PATENT DOCUMENTS

| JP | 09-082742 | 3/1997 |
| JP | 2002-016100 | 1/2002 |

OTHER PUBLICATIONS

English language abstract of Japanese Publication No. 09-082742.
English language abstract of Japanese Publication No. 2002-016100.
* cited by examiner

*Primary Examiner*—N Drew Richards
*Assistant Examiner*—Mamadou Diallo
(74) *Attorney, Agent, or Firm*—Marger Johnson & McCollom, P.C.

(57) ABSTRACT

Provided are a semiconductor package and a method of manufacturing the semiconductor package, and more particularly, a semiconductor package with bonding wires and a method of manufacturing the semiconductor package. The semiconductor package includes a substrate including a finger, at least one semiconductor chip stacked on the substrate, the semiconductor chip including a chip pad, and a wire which electrically connects the finger with the chip pad, wherein one end of the wire bonds with an upper surface and lateral surfaces of the finger.

14 Claims, 9 Drawing Sheets

SEMICONDUCTOR PACKAGE AND METHOD OF MANUFACTURING THE SAME

CROSS-REFERENCE TO RELATED PATENT APPLICATION

This application claims priority under 35 USC § 119 to Korean Patent Application No. 10-2006-0130837, filed on Dec. 20, 2006 in the Korean Intellectual Property Office, the disclosure of which is incorporated herein in its entirety by reference.

BACKGROUND

1. Technical Field

The present invention relates to a semiconductor package and a method of manufacturing a semiconductor package, and more particularly, a semiconductor package with bonding wires and a method of manufacturing the semiconductor package.

2. Description of the Related Art

As portable electronic devices become increasingly miniaturized, the demand for a reduced thickness semiconductor package has significantly increased. Thus, a type of semiconductor package, such as a multi-chip package (MCP), in which a plurality of semiconductor chips are embodied on a substrate has been developed. Accordingly, the number of wires, which electrically connect a chip pad that is on a semiconductor chip with a finger that is on a substrate, have increased. On the other hand, the finger, which is formed on the substrate, needs to be relatively small, and thus, problems occur when the finger is bonded with the wires.

FIG. 1A is a cross-sectional view of a conventional semiconductor package.

Referring to FIG. 1A, a first semiconductor chip 30_1 is adhered onto a substrate 10 using an adhesion layer 20_1. A second semiconductor chip 30_2 is adhered onto the first semiconductor chip 30_1 using an adhesion layer 20_2. A first wire 60_1 is formed to electrically connect a first chip pad 31_1, which is on the first semiconductor chip 30_1, with a finger 11, which is on the substrate 10. A protrusion 62_2 is formed on one end of the first wire 60_1 so as to be formed on the finger 11, and a bump 64_1 is formed on the other end of the first wire 60_1 so as to be formed on the first chip pad 31_1. A second wire 60_2 is formed to electrically connect a second chip pad 31_2, which is on the second semiconductor chip 30_2, with the finger 11, which is on the substrate 10. A protrusion 62_2 is formed on one end of the second wire 60_2 so as to be formed on the finger 11, and a bump 64_2 is formed on the other end of the second wire 60_2 so as to be formed on the second chip pad 31_2.

FIG. 1B is a perspective view of protrusions 62_2 and 62_1 formed on the finger 11 of FIG. 1A, and FIG. 1C is a cross-sectional view of the protrusions 62_2 and 62_1 taken along line X-X' of FIG. 1B.

Referring to FIGS. 1B and 1C, the protrusion 62_1, which is formed on one end of the first wire 60_1, and the protrusion 62_2, which is formed on one end of the second wire 60_2, are disposed on the finger 11. Generally, a protrusion is formed by applying a load to a protrusion ball formed around a tip of a capillary providing a wire onto the finger 11. When the substrate 10 is viewed along its normal direction, the shape of an upper surface 11a of the finger 11 is a quadrangle. The width of the upper surface 11a of the finger 11 measured along a short side is less than the diameter of each of the protrusions 62_1 and 62_2. However, the length of the upper surface 11a of the finger 11 measured along a long side is greater than the diameter of each of the protrusions 62_1 and 62_2. Accordingly, even if a load is applied to the protrusion ball, it is difficult for the protrusions 62_1 and 62_2 to be disposed below the upper surface of the finger 11. In addition, lateral surfaces 11c of the finger 11 do not contact the protrusions 62_1 and 62_2.

Hence, a protrusion formed on one end of a wire is bonded with a finger only at an upper surface of the finger, not the lateral surfaces of the finger. However, since the finger is relatively small, an area of the upper surface of the finger needs to be small also. Accordingly, since an electrical contact area is reduced, an electrical resistance between the protrusion and the finger increases. In addition, since a bonding area is reduced, a wire may easily separate from the finger due to physical impact and thus, product defects may occur.

The present invention addresses these and other disadvantages of the conventional art.

SUMMARY

The present invention provides a semiconductor package, which has an enlarged area on which a wire and a finger are bonded. The present invention also provides a method of manufacturing the semiconductor package.

According to an aspect of the present invention, there is provided a semiconductor package comprising: a substrate including a finger; at least one semiconductor chip stacked on the substrate and including a chip pad; and a wire that electrically connects the finger with the chip pad, wherein one end of the wire is bonded with an upper surface and lateral surfaces of the finger.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1A:
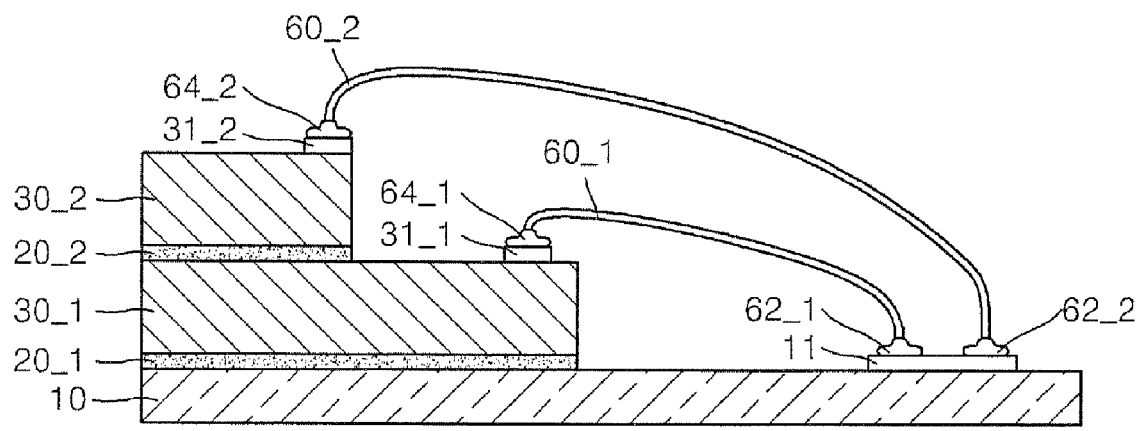
FIG. 1A is a cross-sectional view of a conventional semiconductor package.
Figure 1B:
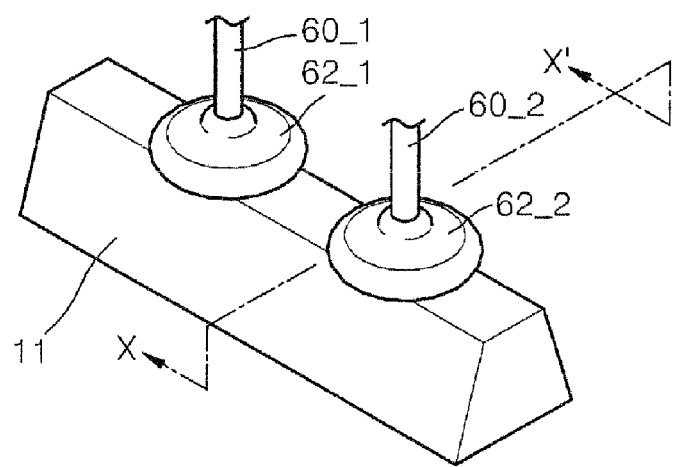
FIG. 1B is a perspective view of protrusions formed on the finger of the conventional semiconductor package of FIG. 1A.
Figure 1C:
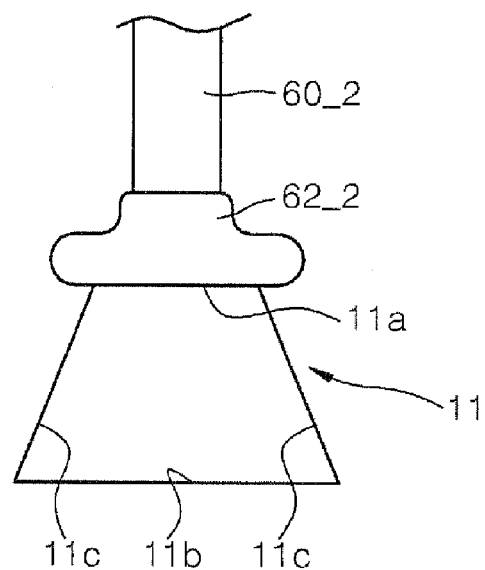
FIG. 1C is a cross-sectional view of the protrusions taken along line X-X' of FIG. 1B.

The present invention will now be described more fully with reference to the accompanying drawings, in which exemplary embodiments of the invention are shown. The invention may, however, be embodied in many different forms, and should not be construed as being limited to the embodiments set forth herein; rather, these embodiments are provided so that this disclosure will be thorough and complete, and will fully convey the concept of the invention to one skilled in the art. In the drawings, the thicknesses of layers and regions are exaggerated for clarity. Like reference numerals denote like elements throughout the specification.

Throughout the specification, it will also be understood that when an element such as a layer, region, or substrate is referred to as being "on" another element, it can be directly on the other element, or intervening elements may also be present. In addition, relative terms such as "lower" or "bottom", and "upper" or "top" may be used to describe a relationship between elements as illustrated in the drawings. These relative terms can be understood to include different directions in addition to the described directions illustrated in the drawings. For example, when elements are turned over in the drawings, elements described to be on lower surfaces of other elements are formed on upper surfaces of the other elements. Therefore, the term "lower" depends only on a predetermined direction and can include both "upper" and "lower" directions. Similarly, when a device is turned over in one of the drawings, elements which are described to be "below or beneath" some other elements are then "above" of the other elements. Accordingly, the term "below" can include both directions "above and below."

Figure 2A:
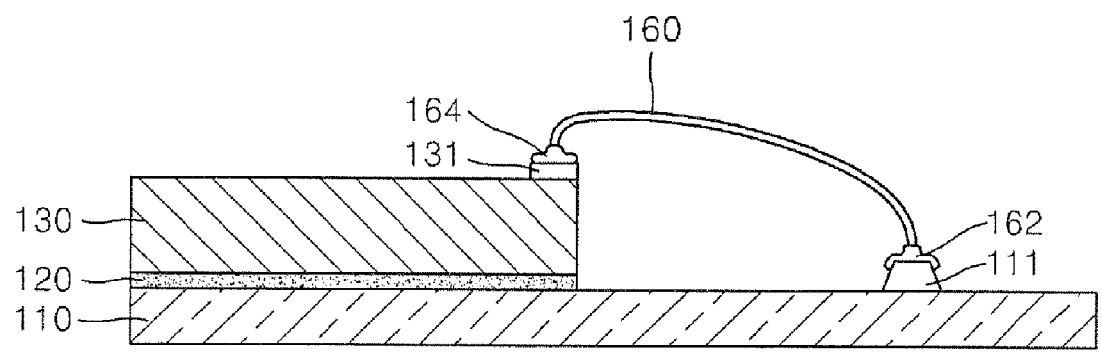
FIG. 2A is a cross-sectional view of a semiconductor package according to an embodiment of the present invention.
Figure 2B:
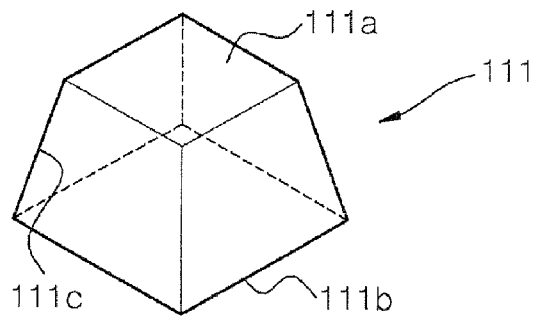
FIG. 2B is a perspective view of a finger of the semiconductor package illustrated in FIG. 2A, according to an embodiment of the present invention.
Figure 2C:
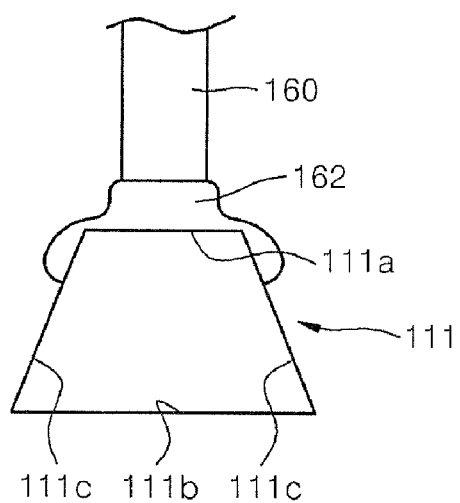
FIG. 2C is a cross-sectional view of a structure of the bonding of the finger and a protrusion in the semiconductor package illustrated in FIG. 2A, according to an embodiment of the present invention.
Figure 2D:
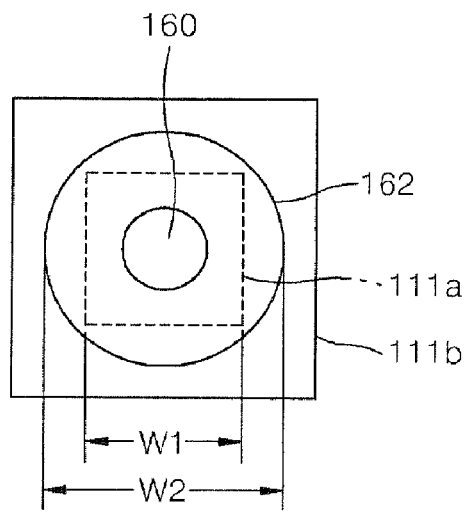
FIG. 2D is a plan view of the structure of FIG. 2C, according to an embodiment of the present invention.

FIG. 2A is a cross-sectional view of a semiconductor package according to an embodiment of the present invention. FIG. 2B is a perspective view of a finger 111 of the semiconductor package illustrated in FIG. 2A. FIG. 2C is a cross-sectional view of a structure of the bonding of the finger 111 and a protrusion 162 in the semiconductor package illustrated in FIG. 2A. FIG. 2D is a plan view of the structure of FIG. 2C.

Referring to FIGS. 2A and 2C, a semiconductor chip 130 is adhered onto a substrate 110 using an adhesion layer 120. A wire 160 is formed to electrically connect a chip pad 131, which is on the semiconductor chip 130, with a finger 111, which is on the substrate 110, wherein a protrusion 162 is formed on one end of the wire 160 so as to be formed on the finger 111, and a bump 164 is formed on the other end of the wire 160 so as to be formed on the chip pad 131. The protrusion 162 is connected to an upper surface 111a and lateral surfaces 111c of the finger 111 in order to bond with the finger 111. Preferably, since the protrusion 162 is formed on one end of the wire 160, the protrusion 162 is connected to the upper surface 111a and the lateral surfaces 111c of the finger 111 in order to bond with the finger 111. The wire 160 may be formed of at least one selected from the group consisting of Au, Cu, Ni and Al. In addition, the finger 111 may be formed of at least one selected from the group consisting of Au, Cu, Ni and Al.

Referring to FIG. 2B, the shape of the upper surface 111a of the finger 111 may be a polygon, in particular, a quadrangle whose sides have the same length, preferably, a square. However, the present invention is not limited thereto, and as understood by one of ordinary skill in the art, the upper surface 111a of the finger 111 may be a round or other shape in other embodiments of the present invention.

Referring to FIG. 2D, according to the plan view of the structure of the bonding of the finger 111 and the protrusion 162, the width W1 of the upper surface 111a of the finger 111 is less than the diameter W2 of the protrusion 162, which is formed on one end of the wire 160. Preferably, when the substrate 110 is viewed along its normal direction, the maximum width of the upper surface 111a of the finger 111 is less than the diameter W2 of the protrusion 162. For example, if the shape of the upper surface 111a of the finger 111 is a rectangle, which includes long sides and short sides, the lengths of the long sides as well as the short sides of the rectangle may be less than the diameter W2 of the protrusion 162. When the substrate 110 is viewed along its normal direction, the finger 111 may be formed so that the upper surface 111a of the finger 111 may be within the lower surface 111b of the finger 111. However, when the substrate 110 is viewed along its normal direction, the finger 111 may be formed so that the upper surface 111a of the finger 111 may correspond to the lower surface 111b of the finger 111.

Figure 3A:
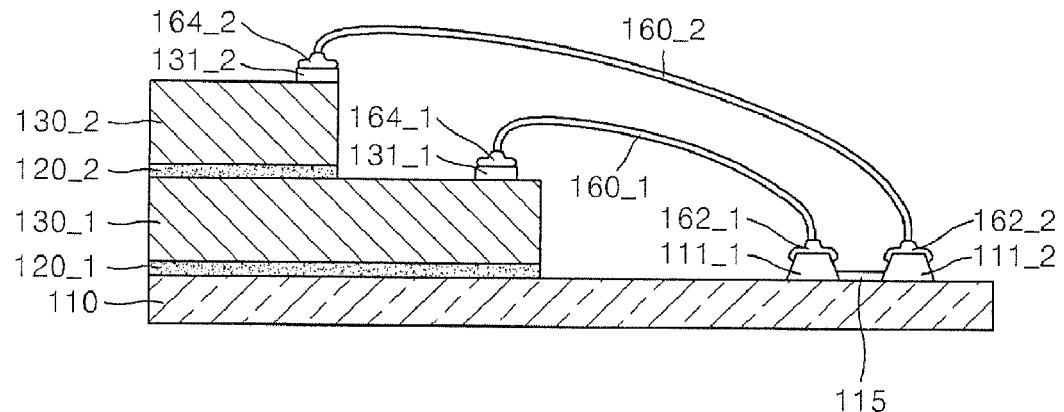
FIG. 3A is a cross-sectional view of a semiconductor package according to another embodiment of the present invention.

FIG. 3A is a cross-sectional view illustrating a semiconductor package according to another embodiment of the present invention.

Referring to FIG. 3A, a first semiconductor chip 130_1 is adhered onto a substrate 110 using an adhesion layer 120_1. A second semiconductor chip 130_2 is adhered onto the first semiconductor chip 130_1 using an adhesion layer 120_2. A first wire 160_1 is formed to electrically connect a first chip pad 131_1 which is on the first semiconductor chip 130_1 with a first finger 111_1, which is on the substrate 110, wherein a protrusion 162_1 is formed on one end of the first wire 160_1 so as to be formed on the first finger 111_1, and a bump 164_1 is formed on the other end of the first wire 160_1 so as to be formed on the first chip pad 131_1. A second wire 160_2 is formed to electrically connect a second chip pad 131_2, which is on the second semiconductor chip 130_2, with a second finger 111_2, which is on the substrate 110, wherein a protrusion 162_2 is formed on one end of the second wire 160_2 and on the second finger 111_2, and a bump 164_2 is formed on the other end of the second wire 160_2 and on the second chip pad 131_2. Hence, when two or more semiconductor chips 130_1 and 130_2 are stacked, wires 160_1 and 160_2 are formed in a plurality, and fingers 111_1 and 111_2 correspond to the wires 160_1 and 160_2 to be formed in the plurality. The technical spirit of the finger 111 described in the FIGS. 2A through 2D similarly applies to each of the fingers 111_1 and 111_2. For example, the protrusion 162_1 formed on one end of the wire 160_1 is bonded with an upper surface and a lateral surface of the finger 111_1 corresponding to the protrusion 162_1. In addition, for example, when the substrate 111 is viewed along its normal direction, the maximum width of the upper surface of the finger 111_1 may be less than the diameter of the protrusion 162_1, and the upper surface of the finger 111_1 may be within a lower surface of the finger 111_1.

Figure 3B:
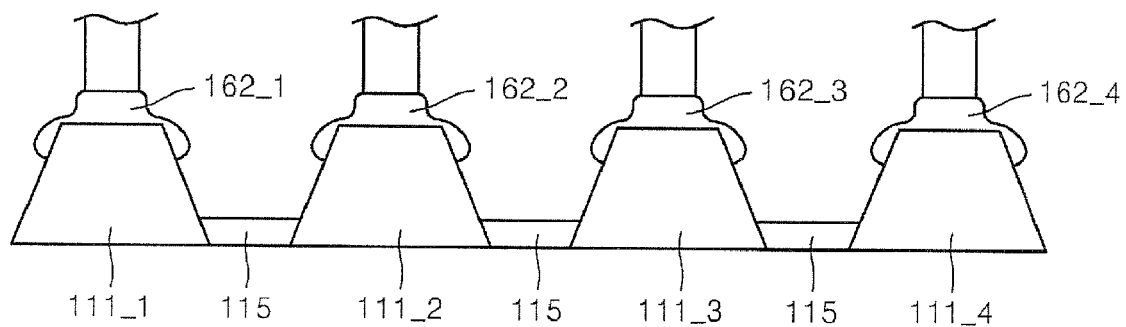
FIG. 3B is a partial cross-sectional view of a semiconductor package according to another embodiment of the present invention.

FIG. 3B is a partial cross-sectional view illustrating a semiconductor package, according to another embodiment of the present invention.

Referring to FIG. 3B, a plurality of fingers 111_1, 111_2, 111_3 and 111_4 are formed to correspond to wires which are formed in the plurality, wherein the fingers 111_1, 111_2, 111_3 and 111_4 are sequentially connected to each other by a conductive bridge 115 formed on the substrate 110. The height of the bridge 115 may be smaller than that of each of the fingers 111_1, 111_2, 111_3 and 111_4. The bridge 115 may be formed of at least one selected from the group consisting of Au, Cu, Ni and Al.

Figure 3C:
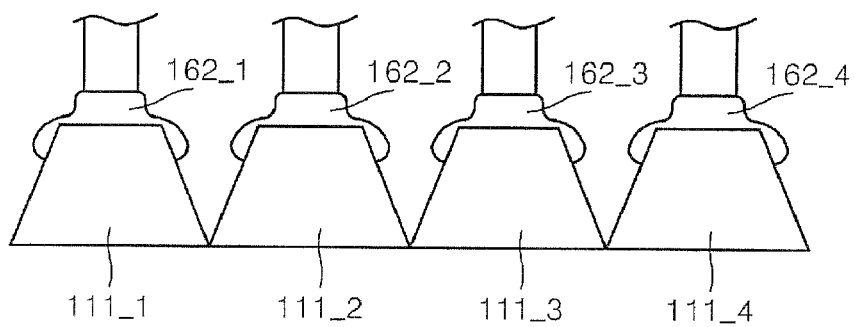
FIG. 3C is a partial cross-sectional view of a semiconductor package according to another embodiment of the present invention.

FIG. 3C is a partial cross-sectional view illustrating a semiconductor package according to another embodiment of the present invention.

Referring to FIG. 3C, the current embodiment of the present invention has a structure in which the boundaries between lateral surfaces of a plurality of fingers 111_1, 111_2, 111_3 and 111_4 are sequentially connected without a bridge so that the fingers 111_1, 111_2, 111_3 and 111_4 are electrically connected to each other. Although the fingers 111_1, 111_2, 111_3 and 111_4 are illustrated to be connected to each other at boundaries between lateral surfaces and lower surfaces of the fingers 111_1, 111_2, 111_3 and 111_4 in FIG. 3C, the pitch of the fingers 111_1, 111_2, 111_3 and 111_4 may be small so that the fingers 111_1, 111_2, 111_3 and 111_4 can be directly connected to each other on the lateral surfaces of the fingers 111_1, 111_2, 111_3 and 111_4. Meanwhile, the technical spirit described in FIGS. 3A and 3B can be similarly applied to the current embodiment of the present invention with the exception of an electrical connection structure between fingers.

FIGS. 4A through 4F are cross-sectional views illustrating a method of manufacturing a semiconductor package, according to an embodiment of the present invention.

Figure 4A:
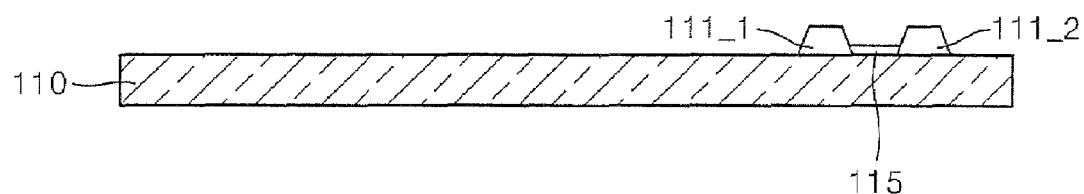
FIGS. 4A through 4F are cross-sectional views illustrating a method of manufacturing a semiconductor package, according to an embodiment of the present invention.

Referring to FIG. 4A, the substrate 110 including the fingers 111_1 and 111_2 is provided. When the fingers 111_1 and 111_2 are formed in a plurality, the bridge 115 is formed between the fingers 111_1 and 111_2 to electrically connect the fingers 111_1 and 111_2 to each other. In the present embodiment, the bridge 115 is formed between the first and second fingers 111_1 and 111_2 to electrically connect them to each other.

Figure 4B:
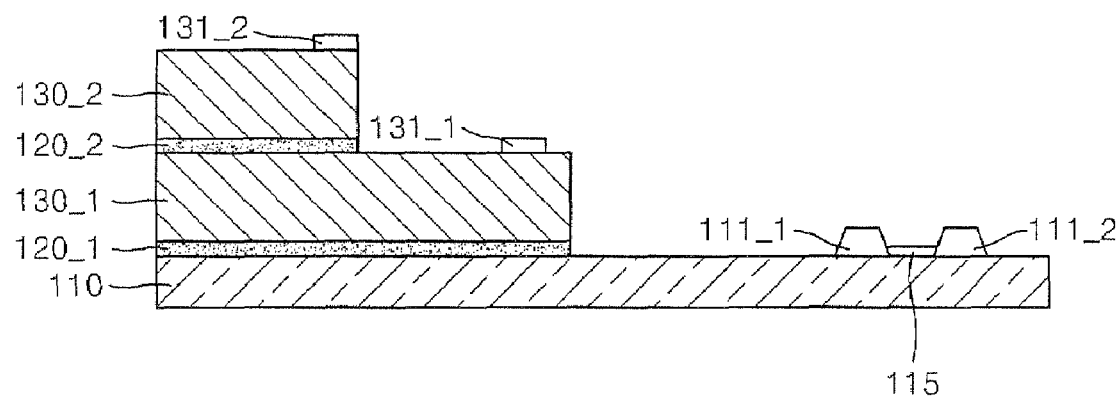

Referring to FIG. 4B, at least one of semiconductor chips 130_1 and 130_2 are sequentially formed on the substrate 110. In order to electrically connect the at least one of the semiconductor chips 130_1 and 130_2 to the substrate 110, the first chip pad 131_1 is formed on the first semiconductor chip 130_1, and the second chip pad 131_2 is formed on the second semiconductor chip 130_2. The first chip pad 131_1 and/or the second chip pad 131_2 may be formed before the semiconductor chips 130_1 and 130_2 are sequentially formed on the substrate 110.

Figure 4C:
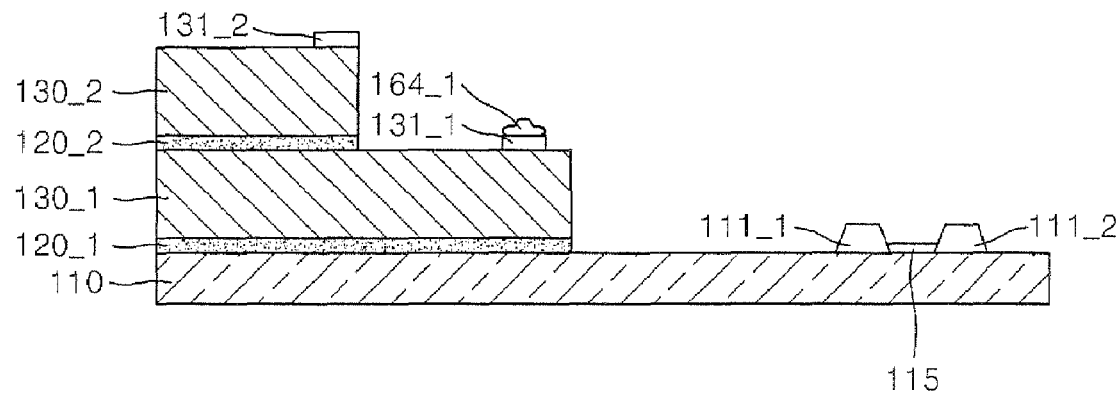

Referring to FIG. 4C, the first bump 164_1 is formed on the first chip pad 131_1 formed on the first semiconductor chip 130_1. The first bump 164_1 may be formed of the same material as that of a wire.

Figure 4D:
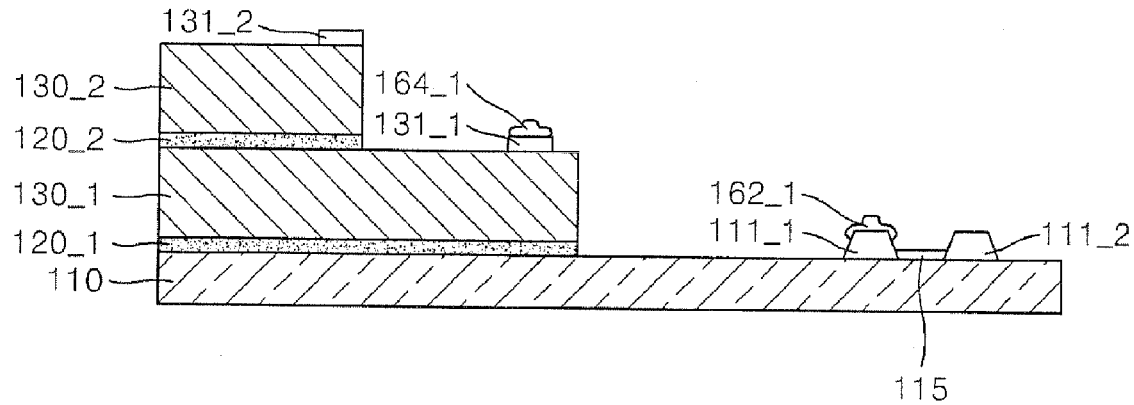

Referring to FIG. 4D, the first protrusion 162_1 is formed on the first finger 111_1. The first protrusion 162_1 is formed in order to bond with an upper surface of the first finger 111_1 and lateral surfaces of the first finger 111_1.

Figure 4E:
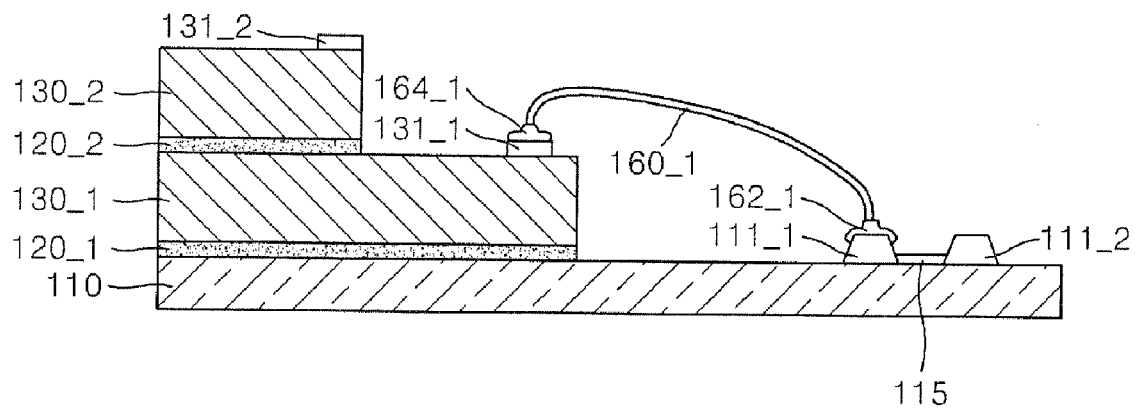

Referring to FIG. 4E, a wire bonding process is performed in order to form the first wire 160_1, which electrically connects the first protrusion 162_1 with the first bump 164_1. A capillary, with the first wire 160_1 passing therethrough, moves in order to provide a conductive material, and as such, the first wire 160_1 may be extended from the first protrusion 162_1 to the first bump 164_1. However, the capillary containing the first wire 160_1 continually moves in order to provide a conductive material, and as such, the first wire 160_1 may be extended from the bump 164_1 to the first protrusion 162_1. In other words, the first wire 160_1 may be bonded to the bump 164_1 first and then bonded to the first protrusion 162_1 next, or the first wire 160_1 may be bonded to the first protrusion 162_1 first and then bonded to the bump 164_1 next.

Figure 4F:
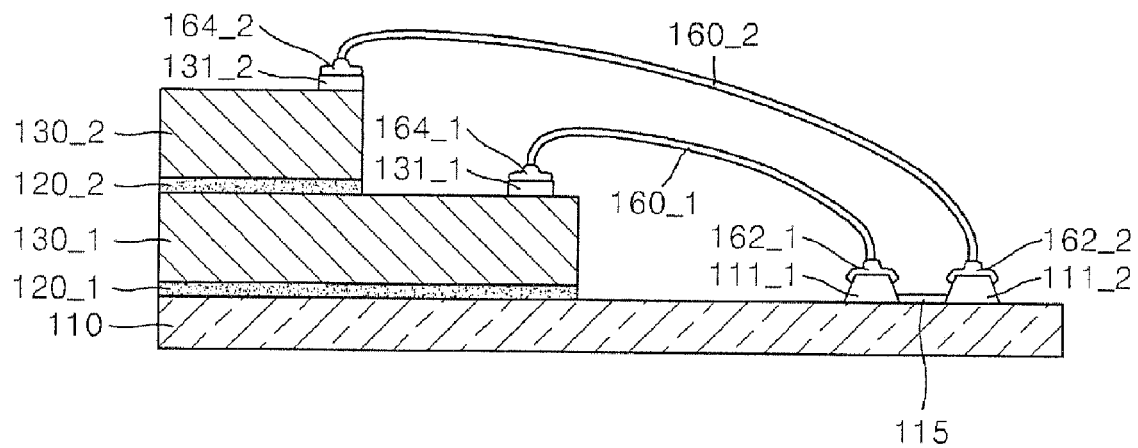

Referring to FIG. 4F, the second wire 160_2 is formed using the same method as that of the first wire 160_1. The first and second protrusions 162_1 and 162_2 and the first and second wires 160_1 and 160_2 may be formed of at least one selected from a group comprising Au, Cu, Ni and Al.

Hereinafter, a method of forming a finger on a substrate 210 will be described.

FIGS. 5A through 5D are cross-sectional views illustrating a method of forming the finger on the substrate 210, according to an embodiment of the present invention.

Figure 5A:
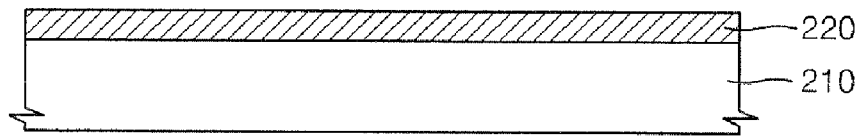
FIGS. 5A through 5D are cross-sectional views illustrating a method of forming a finger on a substrate, according to an embodiment of the present invention.
Figure 5B:
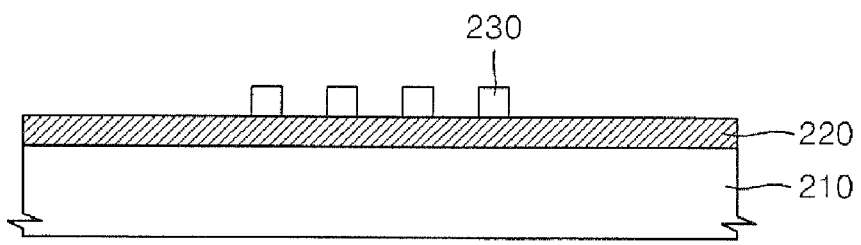

Referring to FIG. 5A, a metal layer 220 is formed on the substrate 210. The metal layer 220 may be formed of at least one selected from the group consisting of Au, Cu, Ni and Al. Alternatively, the metal layer 220 may be formed using a plating process. Referring to FIG. 5B, a dryfilm pattern 230, for covering a region on which the finger is to be disposed, is formed on the metal layer 220. A dryfilm is a passivation layer film for forming a lower pattern during etching. The depositing of a material layer, and the exposing and etching for forming the dryfilm pattern 230 are well known to one of ordinary skill in the art, and thus, their description will be omitted.

Figure 5C:
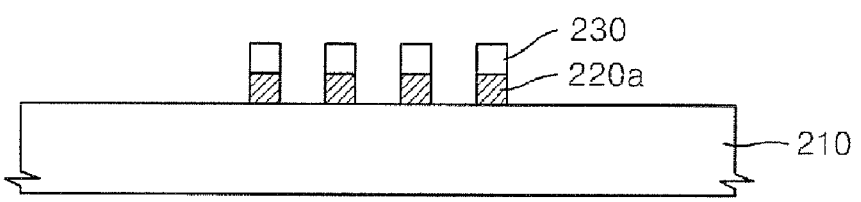

Referring to FIG. 5C, the metal layer 220 is etched using the dryfilm pattern 230 as an etching mask to form a metal layer pattern 220a. Although not illustrated, when the metal layer pattern 220a is formed using wet etching, an upper surface of the metal layer pattern 220a may be narrower than a lower surface of the metal layer pattern 220a, and thus, a sectional shape of the metal layer pattern 220a may be a trapezoid.

Figure 5D:
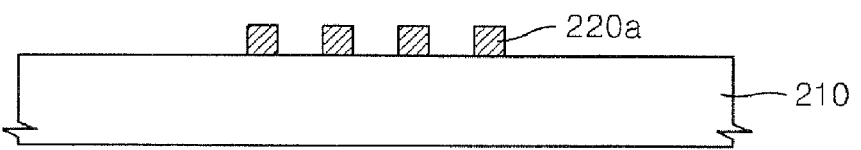

Referring to FIG. 5D, the dryfilm pattern 230 is removed to complete a structure in which the metal layer pattern 220a is formed on the substrate 210 such that metal layer pattern 220a may be a finger.

When the metal layer 220 is formed using the plating process, the method of forming the finger according to the current embodiment of the present invention may further include forming a seed layer comprising copper on the substrate 210 prior to forming the metal layer 220. In addition, after the metal layer pattern 220a is formed, the seed layer may be etched to form a seed layer pattern using the dryfilm pattern 230 as an etching mask.

FIGS. 6A through 6D are cross-sectional views illustrating a method of forming a finger on a substrate, according to another embodiment of the present invention.

Figure 6A:
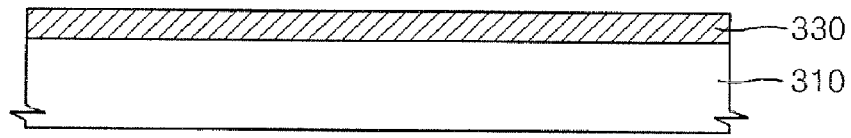
FIGS. 6A through 6D are cross-sectional views illustrating a method of forming a finger on a substrate, according to another embodiment of the present invention.

Referring to FIG. 6A, a dryfilm 330 is formed on a substrate 310.

Figure 6B:
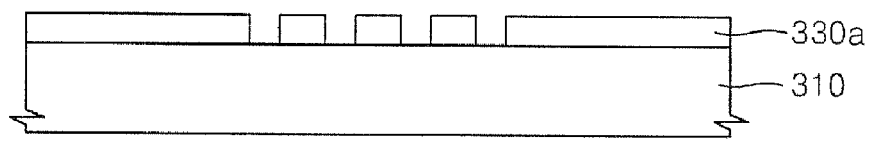

Referring to FIG. 6B, a dryfilm pattern 330a, for exposing a region on which a finger is to be disposed, is formed on the substrate 310.

Figure 6C:
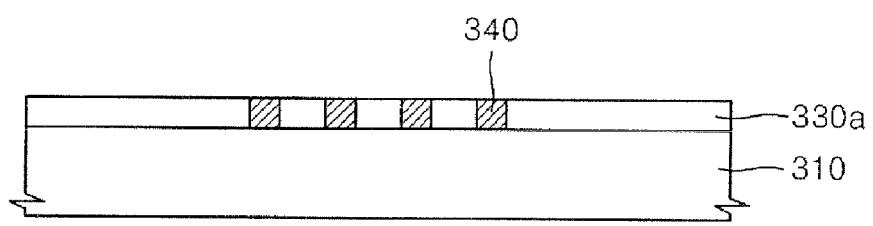

Referring to FIG. 6C, the region, on which the finger is to be disposed, is plated with a metal layer pattern 340. For example, after an upper surface of the substrate 310 that includes the dryfilm pattern 330a is plated with a metal layer, an etch-back or polishing may be performed on the upper surface of the substrate 310 until the dryfilm pattern 330a is exposed. Thus, the metal layer pattern 340 is formed. The metal layer pattern 340 may be formed of one selected from the group consisting of Au, Cu, Ni and Al.

Figure 6D:
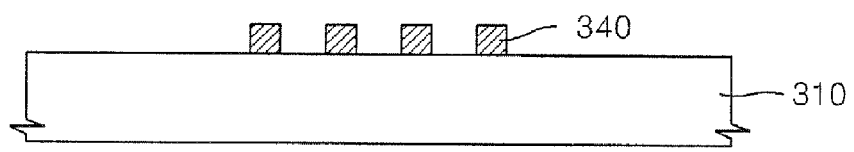

Referring to FIG. 6D, the dryfilm pattern 330a is removed to complete a structure in which the metal layer pattern 340 is formed on the substrate 310 such that the metal layer pattern 340 may be the finger on the substrate 310.

Additionally, the forming of the finger according to the current embodiment may further include a seed layer (not shown), which is formed of copper, on the substrate 310.

When the finger is formed in a plurality, a bridge, which is conductive, connecting the fingers to each other may be formed. The bridge formed on a substrate can be formed using a common method, which is well known to one of ordinary skill in the art, and thus, a method of forming the bridge will not be described.

Hereinafter, a method of forming a protrusion will be described.

Figure 7A:
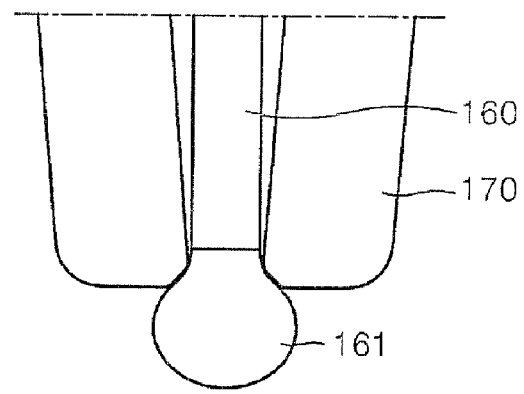
FIG. 7A is a cross-sectional view of a protrusion ball formed around the tip of a capillary of a wire, according to an embodiment of the present invention.
Figure 7B:
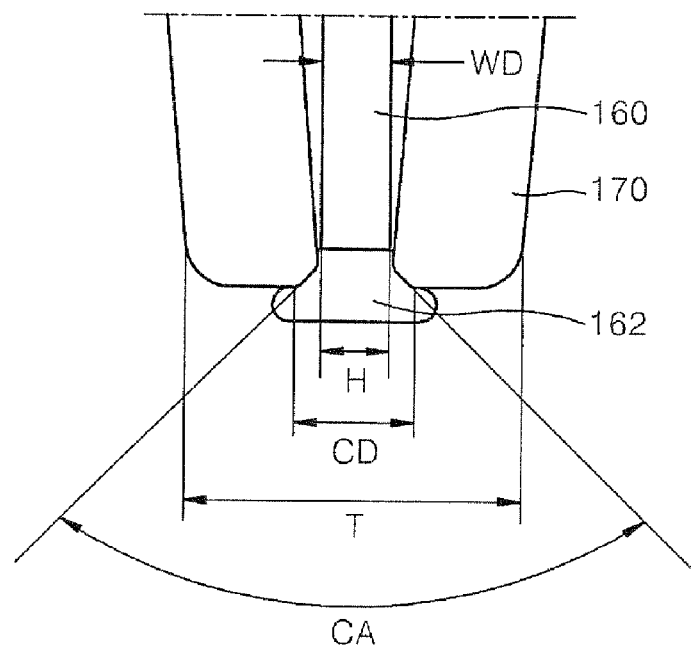
FIG. 7B is a cross-sectional view of a protrusion formed by applying a load to a protrusion ball, according to an embodiment of the present invention.

FIG. 7A is a cross-sectional view illustrating a protrusion ball 161, which is formed around a tip of a capillary 170 through which the wire 160 passes, according to an embodiment of the present invention. FIG. 7B is a cross-sectional view illustrating a protrusion 162 formed by applying a load to the protrusion ball 161, according to an embodiment of the present invention.

Referring to FIGS. 7A and 7B, the protrusion ball 161 is disposed around the tip of the capillary 170 through which the wire 160 passes. The protrusion ball 161 may have a spherical shape, and may be formed of the same material as that of the wire 160. When the protrusion ball 161, which is formed around the tip of the capillary 170, contacts an upper surface 111a of the finger 111, a load is applied to the protrusion ball 161 in order to form the protrusion 162 on one end of the wire 160. The diameter "WD" of the wire 160 is determined according to the hole size "H" of the capillary 170. The size and the shape of the protrusion ball 161 are determined according to the chamber diameter "CD" and the chamber angle "CA" of the capillary 170, respectively. The tip diameter "T" of the capillary 170 may be greater than the width W1 of the upper surface 111a of the finger 111. In addition, when the substrate 110 is viewed along its normal direction, since the width W1 of the upper surface 111a of the finger 111 is less than the diameter of the protrusion 162 or the diameter of the protrusion ball 161 the protrusion 162 is bonded to the upper surface 111a and the lateral surfaces 111c of the finger 111 while the load is applied to the protrusion ball 161.

The protrusion 162 is formed under the conditions where the load that is applied to the protrusion ball 161 is in the range of about 10 to about 70 gF at a temperature in the range of about 110 to about 180° C. during about 5 to about 55 msecs. When the load and temperature conditions are less than the minimum values of the conditions, it is difficult for the protrusion 162 to bond with the lateral surfaces of the finger 111. Additionally, if the conditions are greater than the maximum values of the conditions, unwanted damage occurs at an upper surface 111a of the finger 111.

In a semiconductor package according to some embodiments of the present invention and a method of manufacturing the semiconductor package, bonding is realized between a protrusion, which is at an end of a wire, with an upper surface and lateral surfaces of a finger, and such bonding can be performed even with a small finger. Therefore, an electrical resistance between the protrusion and the finger is decreased and the mechanical stability of the bond between the protrusion and the finger is increased.

According to an aspect of the present invention, there is provided a semiconductor package comprising: a substrate including a finger; at least one semiconductor chip stacked on the substrate, the at least one semiconductor chip including a chip pad; and a wire that electrically connects the finger with the chip pad, wherein one end of the wire is bonded with an upper surface and lateral surfaces of the finger.

A protrusion may be formed on one end of the wire in order to bond with the upper surface and the lateral surfaces of the finger, and when the substrate is viewed along its normal direction, the maximum width of the upper surface of the finger may be less than the diameter of the protrusion.

The upper surface of the finger may be within a lower surface of the finger when the substrate is viewed along its normal direction.

The shape of the upper surface of the finger may be a quadrangle.

According to another aspect of the present invention, there is provided a method of manufacturing a semiconductor package, the method comprising: forming a substrate including a finger; stacking at least one semiconductor chip, which includes a chip pad, on the substrate; and bonding a wire to the finger with the chip pad, wherein one end of the wire is bonded with an upper surface and lateral surfaces of the finger.

The bonding may comprise forming a protrusion on one end of the wire by applying a load to a protrusion ball formed around a tip of a capillary.

The forming of the substrate may comprise forming a metal layer on the substrate; forming a dryfilm pattern covering regions of the metal layer on which a finger is to be disposed; and etching the metal layer using the dryfilm pattern as an etching mask in order to form a metal layer pattern.

The forming of the substrate including the finger may comprise: forming a dryfilm layer that exposes regions of the substrate on which the finger is to be disposed; plating a metal layer pattern on the region on which the finger is to be disposed; and removing the dryfilm layer.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. A semiconductor package comprising:
   a substrate including a finger;
   at least one semiconductor chip stacked on the substrate, the at least one semiconductor chip including a chip pad; and
   a wire that electrically connects the finger with the chip pad,
   wherein a protrusion at one end of the wire is bonded with an upper surface and lateral surfaces of the finger and wherein a center of the wire and a portion of the protrusion bonded to the lateral surfaces of the finger comprise the same material.

2. The semiconductor package of claim 1, wherein the protrusion is formed on one end of the wire in order to bond with the upper surface and the lateral surfaces of the finger, and when the substrate is viewed along its normal direction, the maximum width of the upper surface of the finger is less than the diameter of the protrusion.

3. The semiconductor package of claim 2, wherein the upper surface of the finger is within a lower surface of the finger when the substrate is viewed along its normal direction.

4. The semiconductor package of claim 2, wherein the shape of the upper surface of the finger is a polygon.

5. The semiconductor package of claim 4, wherein the polygon is a quadrangle whose sides are of substantially the same length.

6. The semiconductor package of claim 2, wherein the upper surface of the finger has a round shape.

7. The semiconductor package of claim 2, wherein the wire comprises at least one selected from the group consisting of Au, Cu, Ni and Al.

8. The semiconductor package of claim 2, wherein the finger comprises at least one selected from the group consisting of Au, Cu, Ni and Al.

9. The semiconductor package of claim 2, wherein the wire is formed as a plurality of wires that respectively correspond to a plurality of fingers that are sequentially connected to each other by a conductive bridge.

10. The semiconductor package of claim 9, wherein a height of the bridge is less than a height of the fingers.

11. The semiconductor package of claim 10, wherein the bridge comprises at least one selected from the group consisting of Au, Cu, Ni and Al.

12. The semiconductor package of claim 3, wherein the wire is formed as a plurality of wires that respectively correspond to a plurality of fingers such that boundaries between the lateral surfaces of the fingers sequentially contact each other such that the fingers are electrically connected to each other.

13. A semiconductor package comprising:
a substrate including a finger;
at least one semiconductor chip stacked on the substrate, the at least one semiconductor chip including a chip pad; and
a wire that electrically connects the finger with the chip pad,
wherein one end of the wire is bonded with an upper surface and lateral surfaces of the finger,
wherein a protrusion is formed on the one end of the wire in order to bond with the upper surface and the lateral surfaces of the finger, and when the substrate is viewed along its normal direction, the maximum width of the upper surface of the finger is less than the diameter of the protrusion,
wherein the shape of the upper surface of the finger is a polygon, and
wherein the polygon is a quadrangle whose sides are of substantially the same length.

14. A semiconductor package comprising:
a substrate including a finger;
at least one semiconductor chip stacked on the substrate, the at least one semiconductor chip including a chip pad; and
a wire that electrically connects the finger with the chip pad,
wherein one end of the wire is bonded with an upper surface and lateral surfaces of the finger,
wherein a protrusion is formed on the one end of the wire in order to bond with the upper surface and the lateral surfaces of the finger, and when the substrate is viewed along its normal direction, the maximum width of the upper surface of the finger is less than the diameter of the protrusion,
wherein the upper surface of the finger is within a lower surface of the finger when the substrate is viewed along its normal direction, and
wherein the wire is formed as a plurality of wires that respectively correspond to a plurality of fingers such that boundaries between the lateral surfaces of the fingers sequentially contact each other such that the fingers are electrically connected to each other.

* * * * *

UNITED STATES PATENT AND TRADEMARK OFFICE
CERTIFICATE OF CORRECTION

PATENT NO. : 7,605,478 B2 Page 1 of 1
APPLICATION NO. : 11/961777
DATED : October 20, 2009
INVENTOR(S) : Kyung-Man Kim et al.

It is certified that error appears in the above-identified patent and that said Letters Patent is hereby corrected as shown below:

Column 1, line 41, the word "62_2" should read -- 62_1 --;
Column 4, line 41, the word "131_1" should read -- 131_1, --;
Column 4, line 41, the word "130_1" should read -- 130_1, --.

Signed and Sealed this

Sixteenth Day of March, 2010

David J. Kappos
*Director of the United States Patent and Trademark Office*